United States Patent
Chang et al.

(10) Patent No.: US 12,557,666 B2
(45) Date of Patent: Feb. 17, 2026

(54) METHOD OF MANUFACTURING CONDUCTIVE STRUCTURE, METHOD OF MANUFACTURING REDISTRIBUTION CIRCUIT STRUCTURE AND METHOD OF MANUFACTURING SEMICONDUCTOR PACKAGE

(71) Applicant: Taiwan Semiconductor Manufacturing Company, Ltd., Hsinchu (TW)

(72) Inventors: Chung-Liang Chang, Hsinchu (TW); Ming-Che Ho, Tainan (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 420 days.

(21) Appl. No.: 18/165,920

(22) Filed: Feb. 7, 2023

(65) Prior Publication Data
US 2024/0194495 A1 Jun. 13, 2024

Related U.S. Application Data

(60) Provisional application No. 63/428,117, filed on Nov. 28, 2022.

(51) Int. Cl.
*H01L 21/48* (2006.01)
*C25D 3/38* (2006.01)
(Continued)

(52) U.S. Cl.
CPC ............. *H01L 21/486* (2013.01); *C25D 3/38* (2013.01); *C25D 7/123* (2013.01);
(Continued)

(58) Field of Classification Search
None
See application file for complete search history.

(56) References Cited

U.S. PATENT DOCUMENTS 3,770,598 A 11/1973 Creutz
3,778,357 A 12/1973 Dahms et al.
(Continued)

*Primary Examiner* — Michelle Mandala
(74) *Attorney, Agent, or Firm* — JCIPRNET

(57) ABSTRACT

A method including the following steps is provided. A seed layer is formed. Conductive material is formed on the seed layer by performing an electrolytic plating process with an electrolytic composition comprising: a source of copper ions; an accelerator agent; and a suppressor agent, by structure represented (1) or (2):

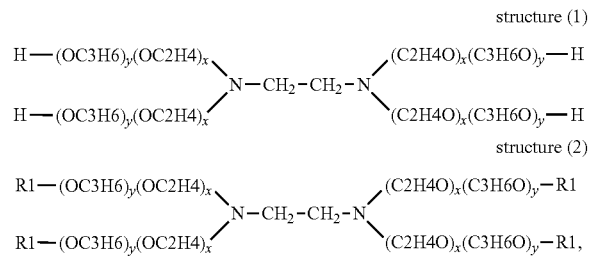

wherein x is between 2 and 50, y is between 5 and 75, and R1 is an alkyl group of 1 to 3 carbon atoms. A portion of the seed layer exposed by the conductive material is removed.

20 Claims, 8 Drawing Sheets

(51) Int. Cl.
*C25D 7/12* (2006.01)
*H01L 21/56* (2006.01)
*H01L 23/00* (2006.01)
*H01L 25/16* (2023.01)

(52) U.S. Cl.
CPC ........ *H01L 21/4857* (2013.01); *H01L 21/565* (2013.01); *H01L 21/568* (2013.01); *H01L 24/16* (2013.01); *H01L 24/32* (2013.01); *H01L 24/73* (2013.01); *H01L 25/162* (2013.01); *H01L 25/165* (2013.01); *H01L 2224/16235* (2013.01); *H01L 2224/32225* (2013.01); *H01L 2224/73204* (2013.01); *H01L 2924/15174* (2013.01); *H01L 2924/182* (2013.01)

(56) References Cited

U.S. PATENT DOCUMENTS

| | | | |
|---|---|---|---|
| 3,956,084 A | 5/1976 | Kardos et al. | |
| 4,374,709 A | 2/1983 | Combs | |
| 4,376,685 A | 3/1983 | Watson | |
| 4,555,315 A | 11/1985 | Barbieri et al. | |
| 4,673,469 A | 6/1987 | Beach et al. | |
| 6,444,110 B2 | 9/2002 | Barstad et al. | |
| 7,303,992 B2 | 12/2007 | Paneccasio et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2006/0141784 A1* | 6/2006 | Paneccasio, Jr. | H01L 21/76877 257/E21.585 |
| 2006/0213780 A1* | 9/2006 | Shih | C25D 7/123 205/261 |
| 2011/0011746 A1* | 1/2011 | Brunner | H05K 3/423 205/125 |
| 2012/0027948 A1* | 2/2012 | Roeger-Goepfert | C23C 18/32 427/430.1 |
| 2019/0368064 A1* | 12/2019 | Richardson | C08G 65/24 |
| 2020/0091124 A1* | 3/2020 | Liao | G02B 6/4201 |
| 2022/0213610 A1* | 7/2022 | Lifschitz Arribio | G03F 7/20 |

\* cited by examiner

METHOD OF MANUFACTURING CONDUCTIVE STRUCTURE, METHOD OF MANUFACTURING REDISTRIBUTION CIRCUIT STRUCTURE AND METHOD OF MANUFACTURING SEMICONDUCTOR PACKAGE

CROSS-REFERENCE TO RELATED APPLICATION

This application claims the priority benefit of U.S. provisional application Ser. No. 63/428,117, filed on Nov. 28, 2022. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. An interconnect feature is a feature such as a via or trench formed in a dielectric layer which is then filled with metal, typically copper, to render the interconnect electrically conductive. Copper has been introduced to replace aluminum to form the connection lines and interconnects in semiconductor substrates. Copper, having better conductivity than any metal except silver, is the metal of choice since copper metallization allows for smaller features and uses less energy to pass electricity. In current processing, interconnect features of semiconductor integrated circuit (IC) devices are metallized using electrolytic copper plating. In order to meet the requirements for smaller sizes and higher packing densities, the electrolytic copper plating method for the interconnect features has become an important issue in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
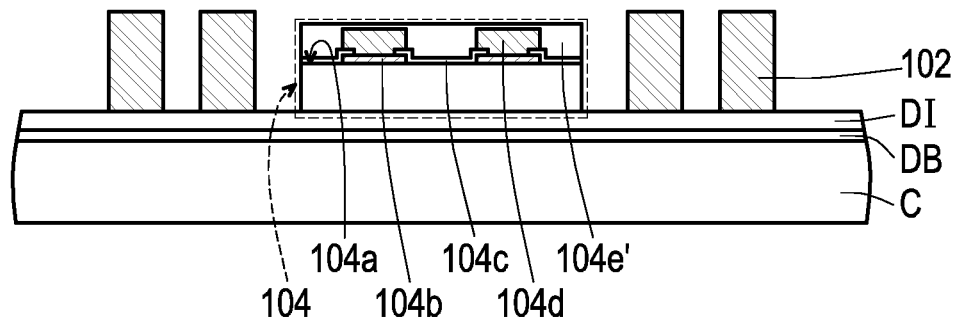
FIGS. 1A-1G are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are schematic cross-sectional views illustrating a manufacturing process of a semiconductor package 10 in accordance with some embodiments of the disclosure. It is understood that the disclosure is not limited by the method described below. Additional operations can be provided before, during, and/or after the method and some of the operations described below can be replaced or eliminated, for additional embodiments of the methods. In exemplary embodiments, the following manufacturing process is part of a wafer level packaging process. In detail, one semiconductor package is shown to represent plural semiconductor packages obtained following the manufacturing process. That is to say, a single package region is illustrated in FIGS. 1A-1G, and the semiconductor package 10 (see FIG. 1G) is formed in the illustrated package region. In exemplary embodiments, the semiconductor package 10 is an integrated fan-out (INFO) package.

Referring to FIG. 1A, a carrier C is provided. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. In some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of pre-fabricated conductive posts 102 and a pre-fabricated integrated circuit 104 are provided over the dielectric layer DI. The integrated circuit 104 is mounted onto the dielectric layer DI having the conductive posts 102 formed thereon. A die attach film (DAF) (not illustrated) is located between the integrated circuit 104 and the dielectric layer DI for adhering the integrated circuit 104 onto the dielectric layer DI. Although one integrated circuit 104 is illustrated in FIG. 1A, a plurality of integrated circuits arranged as an array may be possible in accordance with some embodiments. In such embodiments, each of the integrated circuits may be surrounded by a plurality of conductive posts 102.

The integrated circuit 104 is, for example, a semiconductor die. The integrated circuit 104 includes an active surface 104a, a plurality of pads 104b distributed on the active surface 104a, a passivation layer 104c covering the active surface 104a, a plurality of conductive pillars 104d, and a protection layer 104e. The pads 104b are partially exposed by the passivation layer 104c, the conductive pillars 104d are disposed on and electrically connected to the pads 104b, and the protection layer 104e covers the conductive pillars 104d and the passivation layer 104c. The conductive pillars 104d are copper pillars or other suitable metal pillars, for example. In some embodiments, the protection layer 104e may be a polybenzoxazole (PBO) layer, a polyimide (PI) layer or other suitable polymers. In some alternative embodiments, the protection layer 104e may be made of inorganic materials. As illustrated in FIG. 1A, the top surface of the integrated circuit 104 is lower than the top surfaces of the conductive posts 102. However, the disclosure is not limited thereto. In some alternative embodiments, the top surface of the integrated circuit 104 may be substantially coplanar with the top surfaces of the conductive posts 102.

Figure 1B:
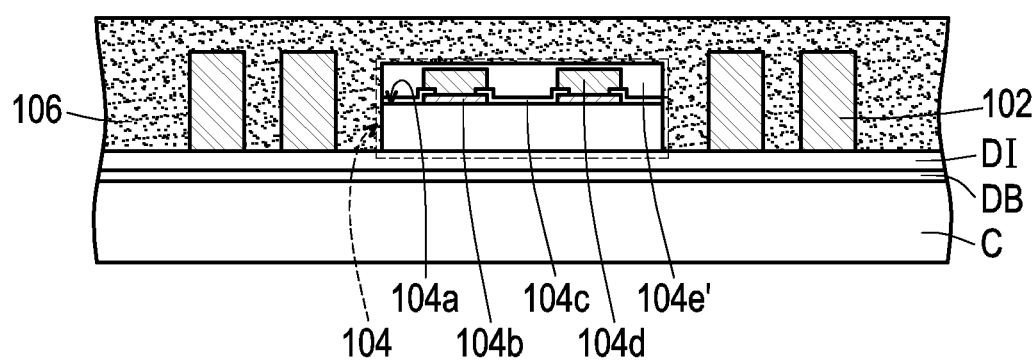

Referring to FIG. 1B, an insulating material 106 is formed on the dielectric layer DI to encapsulate the conductive posts 102 and the integrated circuit 104. In some embodiments, the insulating material 106 is a molding compound formed by a molding process. The conductive posts 102 and the protection layer 104e of the integrated circuit 104 are encapsulated by the insulating material 106. In other words, the conductive posts 102 and the protection layer 104e of the integrated circuit 104 are not revealed and are well protected by the insulating material 106. In some embodiments, the insulating material 106 may include epoxy or other suitable materials.

Figure 1C:
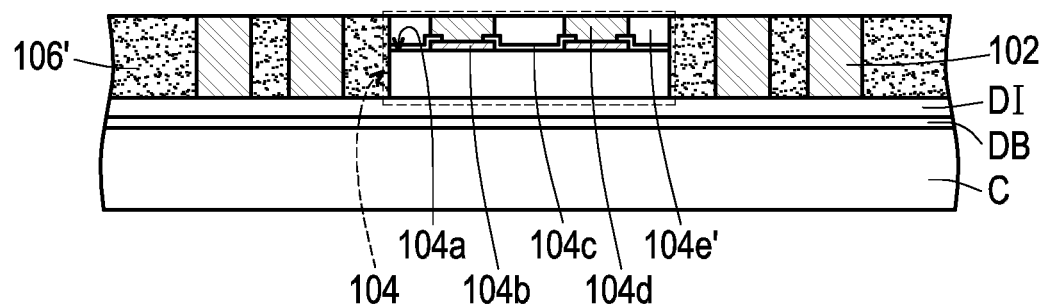

Referring to FIG. 1C, the insulating material 106 and the protection layer 104e of the integrated circuit 104 are grinded until the top surfaces of the conductive pillars 104d are exposed. After the insulating material 106 is grinded, an insulating encapsulation 106' is formed over the dielectric layer DI. During the aforementioned grinding process, portions of the protection layer 104e are also grinded to form a protection layer 104e'. In some embodiments, during the aforementioned grinding process of the insulating material 106 and the protection layer 104e, portions of the conductive pillars 104d and portions of the conductive posts 102 are grinded until the top surfaces of the conductive pillars 104d and the top surfaces of the conductive posts 102 are exposed. In other words, the insulating encapsulation 106' exposes at least part of the integrated circuit 104 and at least part of the conductive posts 102. In some embodiments, the insulating encapsulation 106' may be formed by a mechanical grinding, a chemical mechanical polishing (CMP), or another suitable mechanism.

The insulating encapsulation 106' encapsulates the sidewalls of the integrated circuit 104, and the insulating encapsulation 106' is penetrated by the conductive posts 102. In other words, the integrated circuit 104 and the conductive posts 102 are embedded in the insulating encapsulation 106'. It should be noted that although the integrated circuit 104 and the conductive posts 102 are embedded in the insulating encapsulation 106', the insulating encapsulation 106' exposes top surfaces of the integrated circuit 104 and the conductive posts 102. In other words, the top surfaces of the conductive posts 102, the top surface of the protection layer 104e', and the top surfaces of the conductive pillar 104d are substantially coplanar with the top surface of the insulating encapsulation 106'.

Figure 1D:
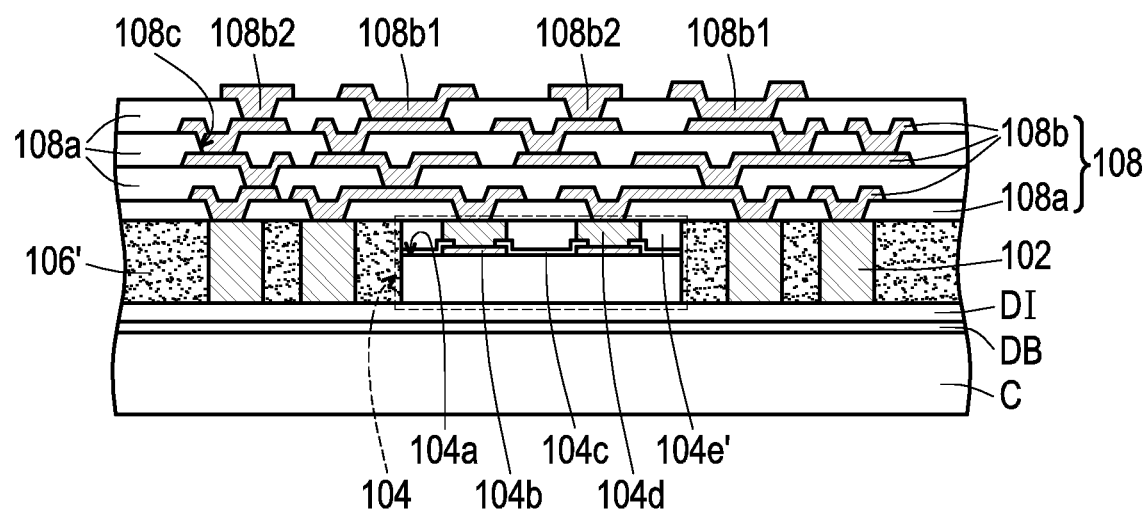
Figure 1E:
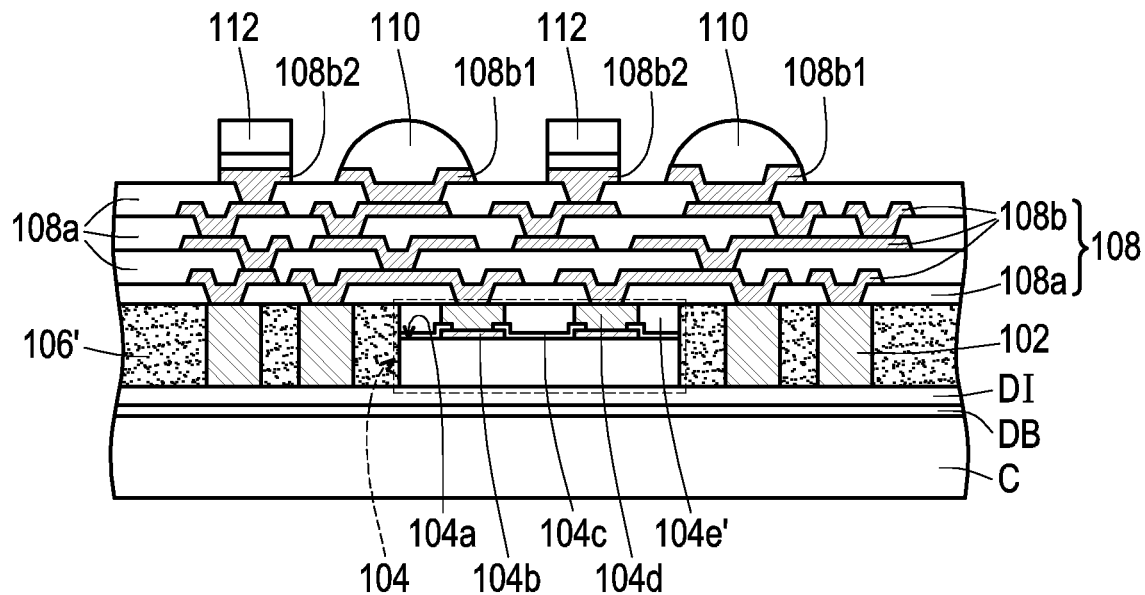

Referring to FIG. 1D, after the insulating encapsulation 106' and the protection layer 104e' are formed, a redistribution circuit structure 108 electrically connected to the conductive pillars 104d of the integrated circuit 104 and the conductive posts 102 is formed on the top surfaces of the conductive posts 102, the top surface of the insulating encapsulation 106', the top surfaces of the conductive pillars 104d, and the top surface of the protection layer 104e'. As shown in FIG. 1D, the redistribution circuit structure 108 includes a plurality of inter-dielectric layers 108a and a plurality of redistribution conductive patterns 108b stacked alternately. The redistribution conductive patterns 108b are electrically connected to the conductive pillars 104d of the integrated circuit 104 and the conductive posts 102 embedded in the insulating encapsulation 106'. In some embodiments, the top surfaces of the conductive pillars 104d and the top surfaces of the conductive posts 102 are in contact with the bottommost redistribution conductive patterns 108b of the redistribution circuit structure 108. The top surfaces of the conductive pillars 104d and the top surfaces of the conductive posts 102 are partially covered by the bottommost inter-dielectric layer 108a. Furthermore, the topmost redistribution conductive patterns 108b include a plurality of pads. In some embodiment, the aforementioned pads include a plurality of under-ball metallurgy (UBM) patterns 108b1 for ball mount and/or at least one connection pads 108b2 for mounting of passive components. The number of the under-ball metallurgy patterns 180b1 and the number of the connection pad 108b2 are not limited in this disclosure.

The detailed formation method of the redistribution circuit structure 108 will be presented below. FIGS. 2A-2F are cross-sectional views illustrating a manufacturing process of the redistribution circuit structure 108 depicted in FIG. 1D, in accordance with some embodiments of the disclosure. It should be noted that the illustrations depicted in FIGS. 2A-2F merely serve as examples for demonstration. As such, scales, dimensions, and shapes illustrated in FIGS. 2A-2F may not completely reflect the redistribution circuit structure 108 illustrated in FIG. 1D. However, same elements are denoted by the same reference numeral to establish a correlation between FIGS. 2A-2F and FIG. 1D.

Figure 2A:
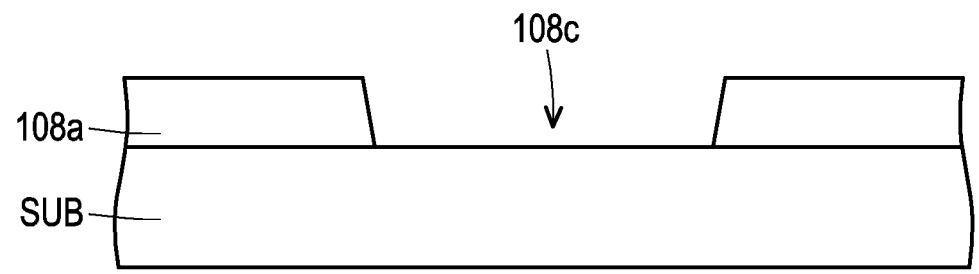
FIGS. 2A-2F are cross-sectional views illustrating a manufacturing process of the redistribution circuit structure depicted in FIG. 1D, in accordance with some embodiments of the disclosure.

Referring to FIG. 2A, a substrate SUB is provided. The substrate SUB has a first region R1 and a second region R2. Subsequently, the inter-dielectric layer 108a is formed over the substrate SUB. Referring to FIG. 2A and FIG. 1D simultaneously, since the bottommost inter-dielectric layer 108a is formed over the carrier C, the de-bonding layer DB, the dielectric layer DI, the conductive posts 102, the integrated circuit 104, and the insulating encapsulation 106', these elements constitute the substrate SUB in some embodiments. However, the disclosure is not limited thereto. In some alternative embodiments, when the redistribution circuit structure 108 is formed prior to the formation of the integrated circuit 104, the substrate SUB may be a carrier. In some embodiments, as shown in FIG. 2A, a contact opening 108c is formed in the inter-dielectric layer 108a so as to render electrical connection between the substrate SUB and the subsequently formed conductive materials. Although one contact opening 108c is illustrated in FIG. 2A, those skilled in the art should understand that a plurality of contact openings are formed in the inter-dielectric layer 108a. For example, as illustrate in FIG. 1D, the contact openings 108c serve as electrical contact windows between the conductive posts 102, the conductive pillars 104d, and the redistribution conductive patterns 108b. However, in some alternative embodiments, the contact openings 108c are not formed at this stage. That is, in some alternative embodiments, the contact openings 108c may be formed after the formation of the redistribution conductive patterns 108b is completed.

Figure 2B:
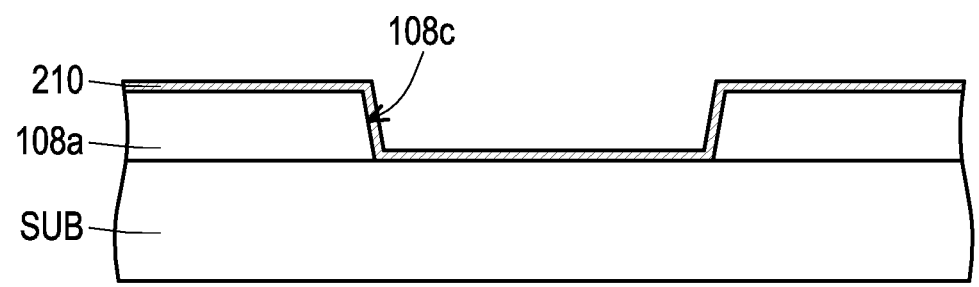

Referring to FIG. 2B, a seed layer 210 is formed over the inter-dielectric layer 108a. In some embodiments, the barrier layer 210 and the seed layer 210 is conformally disposed over the inter-dielectric layer 108a. That is, the barrier layer 210 and the seed layer 210 extends into the contact opening 108c to cover a bottom surface and sidewalls of the contact opening 108c. In some alternative embodiments, as mentioned above, the contact openings 108c are not formed at this stage. Under this scenario, the barrier layer 210 and the seed layer 210 is a flat layer extending over the inter-dielectric layer 108a. The barrier layer 210 may comprise, for example, titanium, titanium nitride, tantalum, tantalum nitride, other suitable materials, or combinations thereof. The material of the seed layer 210 may include, for example, copper, copper alloys, or other suitable choice of materials. In some embodiments, the seed layer 210 is formed by physical vapor deposition or other applicable methods. The thickness of the seed layer 210 may range between about 0.01 μm to about 1 μm. In some alternative embodiments, a barrier layer may be formed before forming the seed layer 210. That is, in such embodiments, the barrier layer and the seed layer 210 are sequentially formed over the inter-dielectric layer 108a. The barrier layer is conformally disposed over the inter-dielectric layer 108a. That is, the barrier layer extends into the contact opening 108c to cover and contact a bottom surface and sidewalls of the contact opening 108c. In the embodiments where the contact openings 108c are not formed at this stage, the barrier layer is a flat layer extending over the inter-dielectric layer 108a. The barrier layer may comprise, for example, titanium, titanium nitride, tantalum, tantalum nitride, other suitable materials, or combinations thereof. In some embodiments, the barrier layer is formed by physical vapor deposition or other applicable methods. The barrier layer may have a thickness of about 0.01 μm to about 1 μm.

Figure 2C:
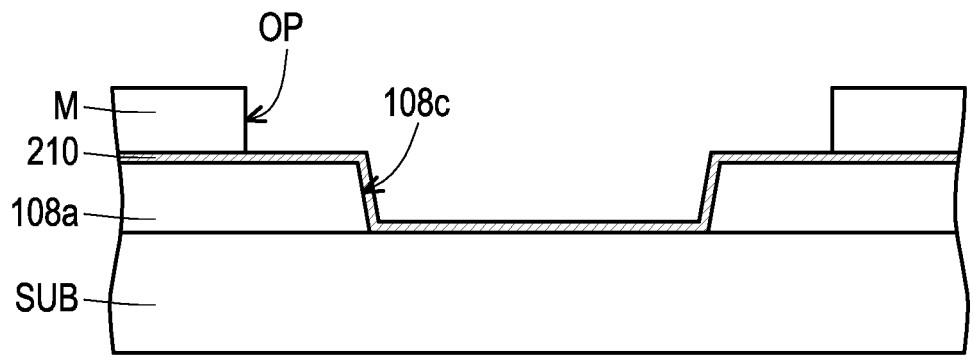

Referring to FIG. 2C, a mask M is formed over the seed layer 210. The mask M is patterned to render an opening OP. In some embodiments, the opening OP corresponds to the contact opening 108c. That is, as mentioned above, although one contact opening 108c is illustrated in FIG. 2A, those skilled in the art should understand that a plurality of openings are formed in the mask M. From another point of view, the opening OP is positioned, such that the vertical projection thereof onto the substrate SUB (i.e., a planar profile/footprint thereof) overlaps with the corresponding contact opening 108c. As mentioned above, the seed layer 210 is disposed conformally into the contact opening 108c. Therefore, the opening OP exposes at least part of the seed layer 210. In some embodiments, the mask M may be formed by a photo resist or a dry film.

Figure 2D:
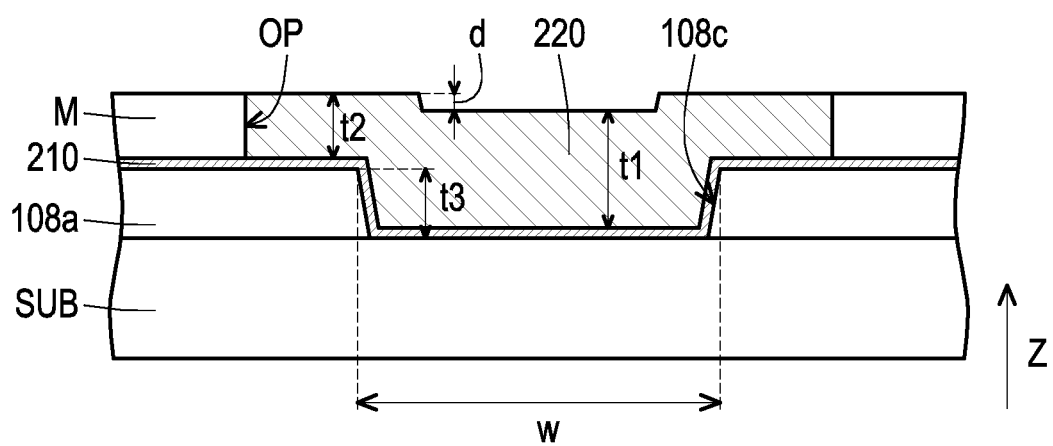

Referring to FIG. 2D, a conductive material 220 is formed in the opening OP of the mask M. In some embodiments, the conductive material 220 is copper or copper alloys. In other words, the seed layer 210 and the conductive material 220 include the same material. For example, the seed layer 210 and the conductive material 220 are made of the same material. In some embodiments, the conductive material 220 is formed by an electrolytic plating process. The electrolytic plating process is performed by using an electroplating composition. The electroplating composition used for forming the conductive material 220 comprises a copper salt, a supporting electrolyte, an accelerator agent and a suppressor agent. The electroplating composition also may contain other components such as one or more leveler agents and the like.

The copper salt is a source of copper ions in an amount sufficient to electrolytically deposit copper onto the substrate SUB and into the conductive material 220. A variety of copper salts may be employed in the subject electroplating composition, including for example copper sulfate, copper methane sulfonate, copper acetate, copper fluoroborate, and cupric nitrate. Copper sulfate is a particularly preferred copper salt. The copper salt may be suitably present in a relatively wide concentration range in the electroplating composition. In some embodiments, the copper salt is employed at a concentration of from about 100 to about 300 grams per liter (g/L) of the electroplating composition. In certain embodiments, the copper salt is employed at a concentration of from about 200 grams per liter of the electroplating composition.

The supporting electrolyte is used to decrease the solution resistance of the electroplating composition. In some embodiments, the electroplating composition employs an acidic electrolyte, which typically will be an acidic aqueous solution and that preferably contains a halide ion source, particularly a chloride ion source. Examples of suitable acids for the supporting electrolyte include sulfuric acid, acetic acid, fluoroboric acid, methane sulfonic acid and sulfamic acid. Sulfuric acid is generally preferred. Chloride ion is a generally preferred halide ion. In some embodiments, the concentration of the acid is from about 20 to about 150 grams per liter of the electroplating composition. In certain embodiments, the concentration of the acid is about 100 grams per liter of the electroplating composition. In some embodiments, the concentration of the halide ion is from about 10 to about 200 parts per million (ppm) of the electroplating composition. Halide ion (e.g., chloride ion) is added in the said concentration range to enhance the function of other additives (i.e., the accelerator agent, the suppressor agent, and the leveler agent (if the leveler agent is employed)). In certain embodiments, the concentration of the halide ion is about 50 ppm of the electroplating composition.

A wide variety of accelerator agents, including known accelerator agents, may be employed in the electroplating composition. Typical accelerator agent contains one or more sulfur atoms, and typically without any nitrogen atoms and a molecular weight of about 1000 or less. The accelerator agent that has sulfide and/or sulfonic acid groups is generally used. In some embodiments, the accelerator agent comprises a group of the formula R'—S—R—SO$_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (e.g., —S—R—SO₃X or substituent of a larger compound). Alkyl group may have 1 to 16 carbons. Preferably, the alkyl group has 1 to 8 or 12 carbons. Heteroalkyl group has one or more hetero (N, O or S) atoms in the chain, and has 1 to 16 carbons. Preferably, the heteroalkyl group has 1 to 8 or 12 carbons. Carbocyclic aryl group is typical aryl group, such as phenyl and naphthyl. Heteroaromatic group also is suitable aryl group, and contains 1 to 3 N, O or S atoms and 1-3 separate or fused rings. Examples of the heteroaromatic group include coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic group typically has 1 to 3 N, O or S atoms and 1 to 3 separate or fused rings. Examples of the heteroalicyclic group include tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include C1-8 alkoxy; C1-8 alkyl; halogen, particularly F, Cl and Br; cyano; nitro and the like.

In some embodiments, the accelerator agent includes those of the following formulae:

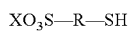

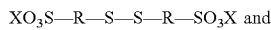

where in the above formulae R is an optionally substituted alkyl group, and preferably is an alkyl group having 1 to 6 carbon atoms, more preferably is an alkyl group having 1 to 4 carbon atoms; Ar is an optionally substituted aryl group such as optionally substituted phenyl or naphthyl; and X is a suitable counter ion such as sodium or potassium.

Some specific suitable accelerator agents include n,n-dimethyl-dithiocarbamic acid-(3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); bissulfopropyl disulfide; 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable accelerator agents are also described in U.S. Pat. Nos. 3,770,598, 4,374,709, 4,376,685, 4,555,315, and 4,673,469, all incorporated herein by reference. In certain embodiments, the accelerator agent for use in the electroplating composition is bis-(sodium-sulfonopropyl)-disulfide.

In some embodiments, the concentration of the accelerator agent is from about 5 to about 50 mg per liter (mg/L) of the electroplating composition. In certain embodiments, the concentration of the accelerator agent is from about 10 to about 40 mg per liter of the electroplating composition.

In some embodiments, the suppressor agent comprises a polyether group covalently bonded to an amine moiety. In some embodiments, the amine is a tertiary amine, and the tertiary amine is weakly basic and becomes protonated and positively charged when added to a solution comprising an acid. In some embodiments, the amine is a diamine. That is, the suppressor agent comprises two amine functional groups.

In some embodiments, the nitrogen atom of the amine moiety is covalently bonded to two ethylene oxide (EO)/propylene oxide (PO) polyethers. The polyether comprises a chain of repeat units, wherein the chain of repeat units can be formed by the polymerization of epoxide monomers. In embodiments where the nitrogen atom is covalently bonded to two EO/PO polyethers, the epoxide monomers are selected from ethylene oxide monomer and propylene oxide monomer. That is, the polyether comprises a chain of repeat units formed by the polymerization of both ethylene oxide monomer and propylene oxide monomer. In some embodiments, the ratio of EO repeat units to the sum of EO repeat units and PO repeat units is between about 0.1 and about 0.6. In some embodiments, the polyether comprises between about 10 and about 85 EO repeat units and between about 56 and about 110 PO repeat units. In certain embodiments, the polyether comprises about 50 EO repeat units and about 75 PO repeat units. Accordingly, in some embodiments, the molecular weight of the polyether can be between as low as about 1000 g/mol and as high as about 20000 g/mol, preferably between about 5000 g/mol and about 10000 g/mol. In certain embodiments, the molecular weight of the polyether is about 7000 g/mol.

In some embodiments, the polyether comprises EO repeat units and PO repeat units in block configurations. In detail, in the block configuration, the linear portion of the polyether chain comprises a block of EO repeat units bonded to a block of PO repeat units. The polyether chain may comprise a diblock. In some embodiments, the polyether chain may comprise a first block of EO repeat units bonded to a second block of PO repeat units. In some embodiments, in the suppressor agent, the first block of the EO repeat units of the polyether is covalently bonded to the nitrogen atom of amine. In some embodiments of the block configuration, each block of repeat units comprises between about 10 and about 200 repeat units, more preferably between about 20 and about 100 repeat units.

In some embodiments, the suppressor agent has a molecular weight between about 1000 and about 20,000. Exemplary suppressor agents comprising a polyether group covalently bonded to a nitrogen atom of amine are shown by structures (1) and (2) below.

Structure (1) is an EO/PO block copolymer of ethylenediamine having the structure:

structure (1)

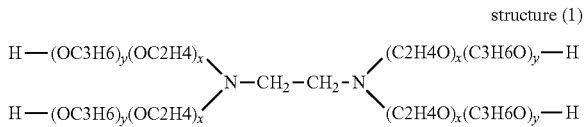

and wherein x is between 2 and 50, and y is between 5 and 75. Accordingly, the suppressor agent having the structure (1) comprises between 8 and 200 total EO repeat units and between 20 and about 300 total PO repeat units on the four EO/PO block copolymers. In some embodiments, x/(x+y)=0.1-0.6. In some embodiments, the molecular weight of the EO (hydrophilic unit) block on a single EO/PO block copolymer is be between about 100 g/mol and about 12000 g/mol, and the molecular weight of the PO (hydrophobic unit) block on a single EO/PO block copolymer is between about 400 g/mol and about 18000 g/mol. In some embodiments, the molecular weight of a single EO/PO copolymer is between about 1000 g/mol about 20000 g/mol. An exemplary suppressor agent having the structure (1) is available from BASF under the trade designation Tetronic 90R4®. This suppressor agent comprises about 14 EO repeat units per EO/PO block copolymer for a total of about 56 EO repeat units on all four EO/PO block copolymers and about 21 PO repeat units per EO/PO block copolymer for a total of about 84 PO repeat units on all four EO/PO block copolymers. Accordingly, the total MW of Tetronic 90R4® is between about 6000 g/mol and about 8000 g/mol. The electroplating composition can comprise a mixture of block copolymers of structure (1).

Structure (2) is an alkyl-capped EO/PO block copolymer of ethylenediamine having the structure:

structure (2)

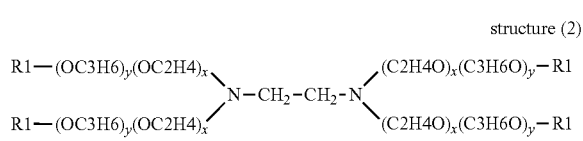

and wherein x is between 2 and 50, y is between 5 and 75, and R1 is an alkyl group of 1 to 3 carbon atoms. That is, the suppressor agent having the structure (2) may be capped by methyl, ethyl or propyl. For example, the suppressor agent having the structure (2) may include methyl-capped EO/PO block copolymer of ethylenediamine, ethyl-capped EO/PO block copolymer of ethylenediamine, or propyl-capped EO/PO block copolymer of ethylenediamine. In some embodiments, $x/(x+y)=0.1-0.6$. In some embodiments, the molecular weight of the EO (hydrophilic unit) block on a single EO/PO block copolymer is be between about 100 g/mol and about 12000 g/mol, and the molecular weight of the PO (hydrophobic unit) block on a single EO/PO block copolymer is between about 400 g/mol and about 18000 g/mol. In some embodiments, the molecular weight of a single EO/PO copolymer is between about 6000 g/mol about 8000 g/mol.

In some embodiments, the concentration of the suppressor agent is from about 0.5 to about 20 mg per liter of the electroplating composition. In certain embodiments, the concentration of the suppressor agent is from about 2.5 to about 10 mg per liter of the electroplating composition.

Use of one or more leveler agents in the electroplating composition is generally preferred. Examples of suitable leveler agents are described and set forth in U.S. Pat. Nos. 3,770,598, 4,374,709, 4,376,685, 4,555,315 and 4,673,459. In general, useful leveler agents include those that contain a substituted amino group such as compounds having R2-N—R2', where each R2 and R2' is independently a substituted or unsubstituted alkyl group or a substituted or unsubstituted aryl group. In some embodiments, the alkyl group has 1 to 6 carbon atoms, more preferably 1 to 4 carbon atoms. In some embodiments, aryl group includes substituted or unsubstituted phenyl or naphthyl. The substituents of the substituted alkyl and aryl groups may be, for example, alkyl, halo and alkoxy.

More specifically, suitable leveler agents include polyalkyleneimine, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polymers; quaternized, acrylic, polymeric amines; polyvinyl carbamates; pyrrolidone; and imidazole. In certain embodiments, the leveler agent is polyethylenimine. In some embodiments, the leveler agent has a molecular weight between about 5000 and about 100,000. In some embodiments, the concentration of the leveler agent is from about 0.5 to about 10 mg per liter of the electroplating composition. In certain embodiments, the concentration of the leveler agent is about 1.5 mg per liter of the electroplating composition.

In embodiments where an alloy is to be deposited for the conductive material 220, the electroplating composition further comprises a source of metal ions of the alloying metal that may be selected from among a source of tin ions, a source of silver ions, a source of zinc ions, a source of manganese ions, a source of zirconium ions, a source of bismuth ions, or a source of transition or refractory metal ions.

By using the suppressor agent having the structure (1) or the structure (2) in the electroplating composition, the ability of bottom-up filling or superfilling of conductive features (e.g., the conductive material 220) is advantageously enhanced, and then conformal and sub-conformal filling is inhibited. Conformal filling or plating is characterized by a deposit of equal thickness at all points of a feature and may lead to pinching off and formation of seams. To achieve defect-free filling, i.e., void-free and seam-free, the deposition rate in the bottom should greatly exceed the deposition rate on the sidewalls. For example, during the electrolytic plating process, the deposition rate along of the bottom (i.e., bottom up or vertical growth rate) is preferably at least one order of magnitude faster than the deposition rate along the sidewalls (i.e., lateral or horizontal growth rate). Superfilling involves filling a feature from the bottom up, rather than at an equal rate on all its surfaces, and thus the electrolytic plating process using the electroplating composition with the suppressor agent having the structure (1) or the structure (2) can avoid seams and pinching off that can result in voiding.

Since the electrolytic plating process involves superfilling by rapid bottom-up deposition at a superfill speed by which the deposition of the conductive material 220 in a vertical direction Z from the bottom of the conductive material 220 to the top of the conductive material 220 is substantially greater than the deposition on the sidewalls, the thickness t1 of the portion of the conductive material 220 at the center of the via is greater than the thickness t2 of the portion of the conductive material 220 out the via and on the inter-dielectric layer 108a, as shown in FIG. 2D. That is, the conductive material 220 is formed non-conformally over the underlying inter-dielectric layer 108a and in the contact opening 108c. From another point of view, as shown in FIG. 2D, the conductive material 220 has dishing, i.e., has a concave top surface. In some embodiments where the thickness t2 is 2 um, the width w of the via is 25 um and the thickness t3 of the via is 5 um, the depth d of the dishing ranges from about 0.5 um to about 1.5 um. However, the disclosure is not limited thereto. In some alternative embodiments, the top surface of the conductive material 220 may has a flat surface profile without dishing.

Further, by using the suppressor agent having the structure (1) or the structure (2) in the electroplating composition, the resulted conductive material 220 possesses the excellent mechanical property, such as fracture toughness. In some embodiments, the fracture toughness of the conductive material 220 measured by nanoindentation method ranges from about 0.50 MPa√m to about 0.52 MPa√m. As such, the fracture toughness of the conductive material 220 is comparable to the fracture toughness of the conductive material plated by an organic-additives free electroplating composition (i.e., virgin-makeup solution, VMS), which is about 0.53 MPa√m for example.

Figure 2E:
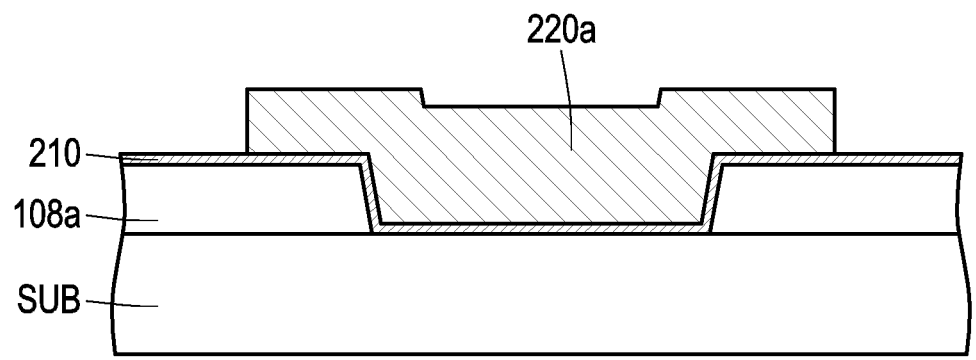

Referring to FIG. 2E, the mask M is subsequently removed to render a conductive patterns 220a. Since the conductive pattern 220a are originated from the opening OP, the conductive pattern 220a also inherent the same configuration. As illustrated in FIG. 2E, after the mask M is removed, portions of the seed layer 210 is exposed by the conductive patterns 220a. In some embodiments, the mask M is removed by a suitable removal process such as ashing, stripping, or the like.

Figure 2F:
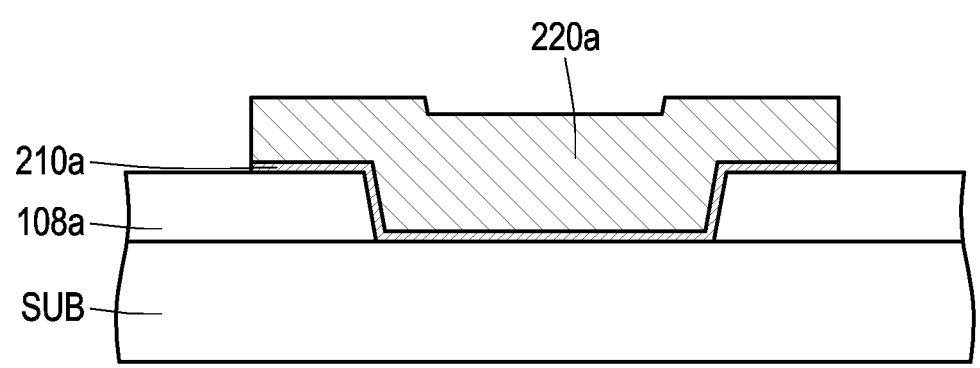

Referring to FIG. 2F, the seed layer 210 is patterned to render a seed layer pattern 210a. In detail, the portions of the seed layer 210 exposed by the conductive patterns 220a are removed to form the seed layer pattern 210a. That is to say, the seed layer pattern 210a is originated from a portion of the seed layer 210 covered by the conductive patterns 220a. On the other hand, the conductive patterns 220a is serve as a mask for partially removing the seed layer 210. In some embodiments, the portions of the seed layer 210 exposed by the conductive patterns 220a are selectively removed through an isotropic etching process or an anisotropic etching process. In some embodiments, the isotropic etching process includes wet etch. In some embodiments, the anisotropic etching process includes dry etch, and the dry etch uses an etchant including Argon (Ar) gas. Specifically, in the process of removing the seed layer 210, the etchant may include argon (Ar) gas and hydrogen ($H_2$) gas. It should be noted that during the etching process, undesired byproduct may be produced. However, hydrogen gas may also serve as a cleaning gas to remove these byproducts. As such, for embodiments that employ hydrogen gas during the etching process, extra cleaning process may not be necessary. It should be noted that, inevitably, materials of the conductive patterns 220a may be partially removed during the etching process of the seed layer 210. As such, a height and the width of the conductive pattern 220a may be reduced.

In some embodiments, the redistribution circuit structure 108 is a single-layered structure. Thus, upon performing the steps illustrated in FIGS. 2A-2F, the redistribution circuit structure 108 is substantially completed. However, in some alternative embodiments, the redistribution circuit structure 108 is a multi-layered structure (for example, the redistribution circuit structure 108 illustrated in FIG. 1D). Under this condition, the steps illustrated in FIGS. 2A-2F may be repeated several times to render the redistribution circuit structure 108.

It should be noted that the steps illustrated in FIGS. 2A-2F are not limited to fabricating the redistribution circuit structure 108 depicted in FIG. 1D. The foregoing step may be utilized in redistribution circuit structures located at other positions in a package, or an interconnect structure in a die. For example, the foregoing steps may be employed in a redistribution circuit structures within other type(s) of the package (e.g., a chip-on-wafer-on-substrate package, a chip-on-wafer package, etc.). However, the disclosure is not limited thereto. In some alternative embodiments, the foregoing step may be utilized in conductive through vias, conductive posts (e.g., conductive posts 102), etc.

Referring back to FIG. 1E, after the redistribution circuit structure 108 is formed, a plurality of conductive terminals 110 are placed on the under-ball metallurgy patterns 108b1, and a plurality of passive components 112 are mounted on the connection pads 108b2. In some embodiments, the conductive terminals 110 may be placed on the under-ball metallurgy patterns 108b1 through a ball placement process or other suitable processes, and the passive components 112 may be mounted on the connection pads 108b2 through a soldering process, a reflowing process, or other suitable processes.

Figure 1F:
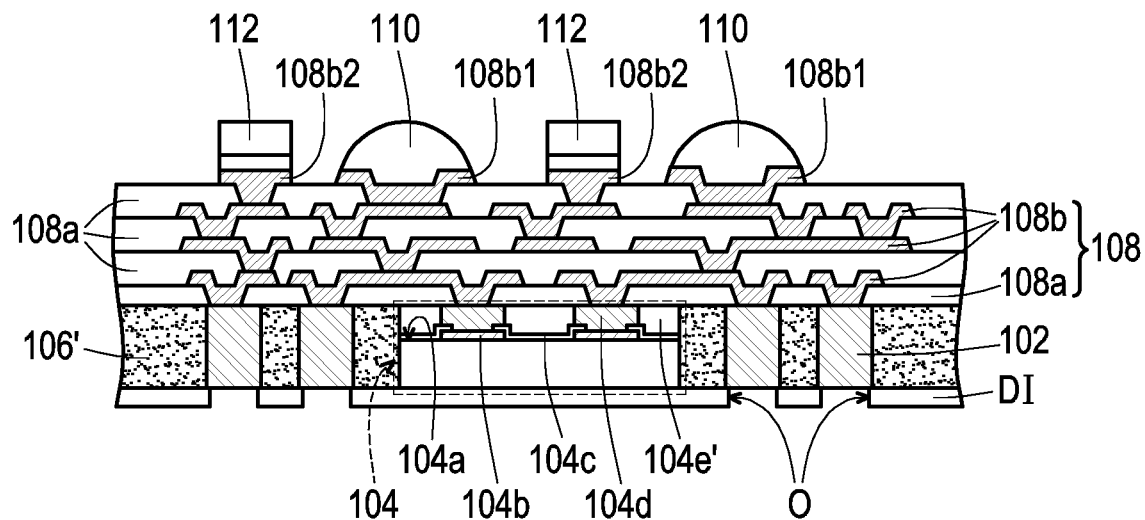

Referring to FIG. IF, after the conductive terminals 110 and the passive components 112 are mounted on the redistribution circuit structure 108, the dielectric layer DI formed on the bottom surface of the insulating encapsulation 106' is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser, such that the dielectric layer DI adhered on the bottom surface of the insulating encapsulation 106' is peeled from the carrier C. As illustrated in FIG. 1F, the dielectric layer DI is then patterned, such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

Figure 1G:
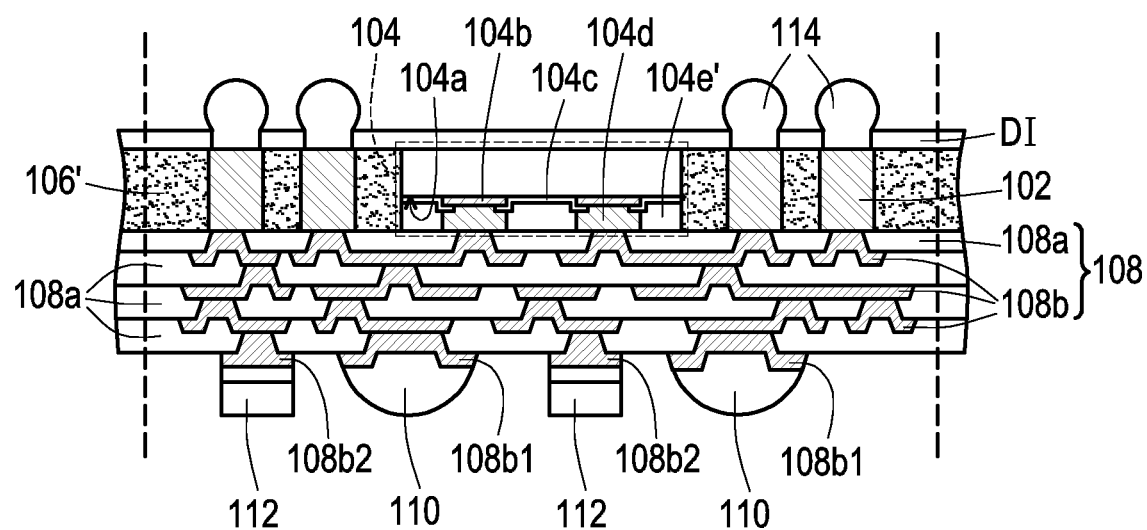

Referring to FIG. 1G, after the contact openings O are formed in the dielectric layer DI, a plurality of conductive terminals 114 are placed in the contact openings O, and the conductive terminals 114 are electrically connected to the conductive posts 102. Herein, the formation of an integrated fan-out (INFO) package array is substantially completed. As illustrated in FIG. 1G, after the conductive terminals 110 and the conductive terminals 114 are formed, the INFO package array is diced to form a plurality of semiconductor packages (i.e., INFO packages) 10 having dual-side terminal design. In some embodiment, the dicing process or singulation process typically involves dicing with a rotating blade or a laser beam. In other words, the dicing or singulation process is, for example, a laser cutting process, a mechanical cutting process, or other suitable processes.

Figure 1H:
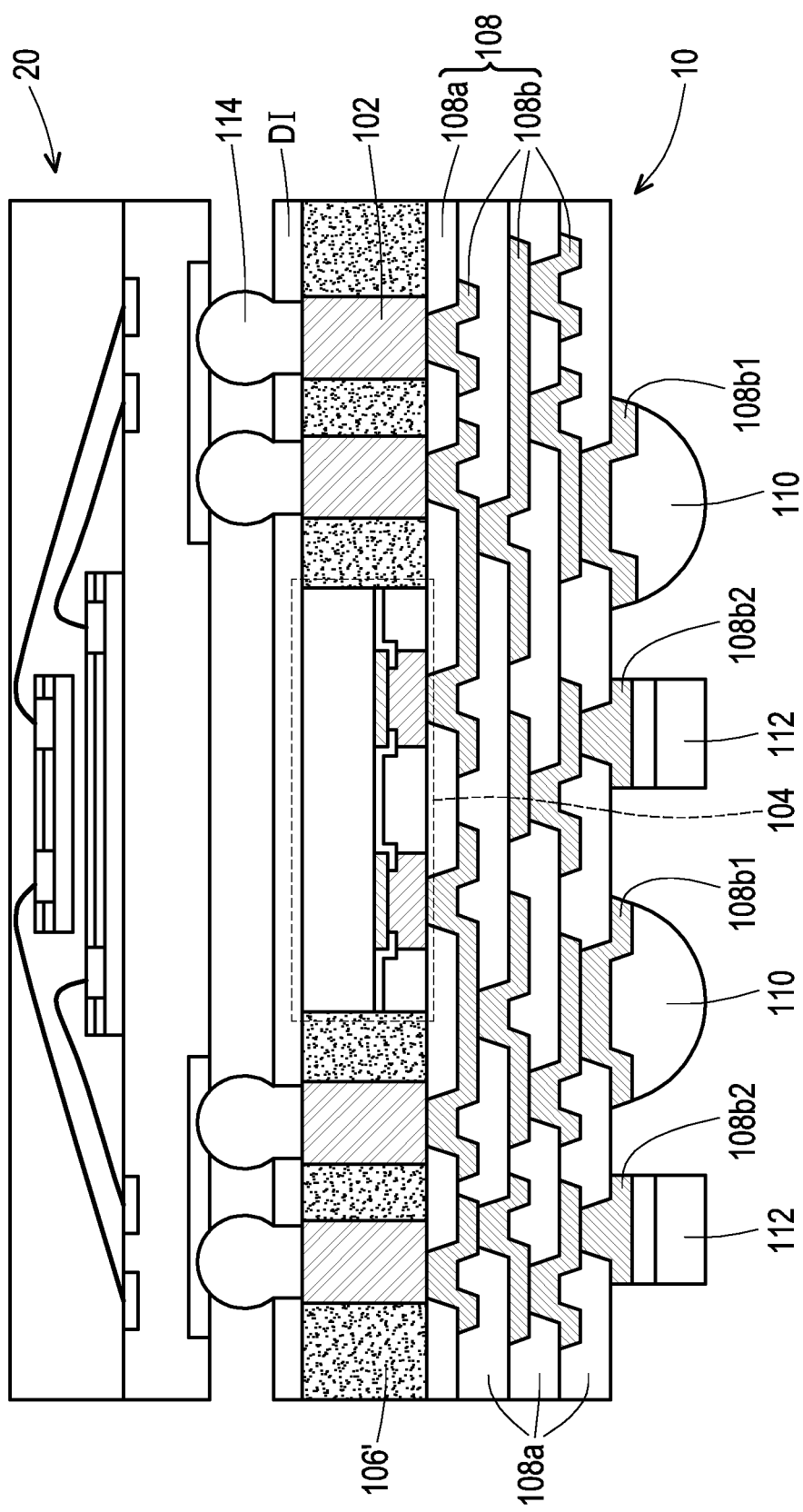
FIG. 1H is a cross-sectional view illustrating a package-on-package (POP) structure in accordance with some embodiments of the disclosure.

FIG. 1H is a cross-sectional view illustrating a package-on-package (POP) structure in accordance with some embodiments of the disclosure. In some embodiments, the semiconductor package 10 may be stack with other electronic devices. For example, referring to FIG. 1H, another package 20 is provided. The package 20 is, for example, an IC package. The package 20 is stacked over and electrically connected to the semiconductor package 10 through the conductive terminals 114 such that the package-on-package (POP) structure is fabricated. It should be noted that FIG. 1H merely serves as an exemplary illustration, and the disclosure is not limited thereto. In some alternative embodiments, the semiconductor package 10 may be stacked with other electronic devices such as another INFO package, a memory device, a ball grid array (BGA), or a wafer. Furthermore, the stacking may be performed preceding the dicing process. For example, the INFO package array illustrated in FIG. 1G may be stacked with a wafer, and the singulation process may be performed on the stacked INFO package array and the wafer simultaneously.

The following examples further illustrate the practice of the present invention.

EXAMPLES

Example 1

An electrolytic composition of the invention was prepared having the following components and concentrations:
200 g/L Copper sulfate
100 g/L Sulfuric acid 50 ppm Chloride ion
20 mg/L Accelerator agent (bis-(sodium-sulfonopropyl)-disulfide)
5 mg/L of Suppressor agent (Tetronic 90R4® (BASF), wherein an average MW of 7000 g/mol, x/(x+y)=0.4).

The conductive feature was plated as follows with the above electrolytic composition. An agitated plating tank outfitted with multiple plating cells and one rectifier was charged with the above electrolytic composition. During plating, the following deposition conditions were employed typically: current density of 2 A/dm$^2$; waveform was DC; temperature plating bath was 25° C. After termination of the electrolytic plating process, a conductive material of Example 1 with 2 um of the thickness t2, 25 um of the width w, and 5 um of the thickness t3 (as shown in FIG. 2D) was obtained. It was found that the copper grain feature of the conductive material of Example 1 was random grain size distribution. It was found that the dishing depth d (as shown in FIG. 2D) of the conductive material of Example 1 was 3.1 um. Further, the fracture toughness of the conductive material of Example 1 measured by nanoindentation method was 0.43 MPa√m.

Example 2

An electrolytic composition of the invention was prepared having the following components and concentrations:
200 g/L Copper sulfate
100 g/L Sulfuric acid
50 ppm Chloride ion
10 mg/L Accelerator agent (bis-(sodium-sulfonopropyl)-disulfide)
2.5 mg/L of Suppressor agent (Tetronic 90R4® (BASF), wherein an average MW of 7000 g/mol, x/(x+y)=0.4).

The conductive feature was plated as follows with the above electrolytic composition. An agitated plating tank outfitted with multiple plating cells and one rectifier was charged with the above electrolytic composition. During plating, the following deposition conditions were employed typically: current density of 2 A/dm$^2$; waveform was DC; temperature plating bath was 25° C. After termination of the electrolytic plating process, a conductive material of Example 2 with 2 um of the thickness t2, 25 um of the width w, and 5 um of the thickness t3 (as shown in FIG. 2D) was obtained. It was found that the copper grain feature of the conductive material of Example 2 was uniform small grain. It was found that the dishing depth d (as shown in FIG. 2D) of the conductive material of Example 2 was 2.77 um. Further, the fracture toughness of the conductive material of Example 2 measured by nanoindentation method was 0.51 MPa√m.

Example 3

An electrolytic composition of the invention was prepared having the following components and concentrations:
200 g/L Copper sulfate
100 g/L Sulfuric acid
50 ppm Chloride ion
10 mg/L Accelerator agent (bis-(sodium-sulfonopropyl)-disulfide)
2.5 mg/L of Suppressor agent (Tetronic 90R4® (BASF), wherein an average MW of 7000 g/mol, x/(x+y)=0.4).

The conductive feature was plated as follows with the above electrolytic composition. An agitated plating tank outfitted with multiple plating cells and one rectifier was charged with the above electrolytic composition. During plating, the following deposition conditions were employed typically: current density of 4 A/dm$^2$; waveform was DC; temperature plating bath was 25° C. After termination of the electrolytic plating process, a conductive material of Example 3 with 2 um of the thickness t2, 25 um of the width w, and 5 um of the thickness t3 (as shown in FIG. 2D) was obtained. It was found that the copper grain feature of the conductive material of Example 3 was larger grain with copper twin crystal, relative to Example 2. It was found that the dishing depth d (as shown in FIG. 2D) of the conductive material of Example 3 was 2.91 um. Further, the fracture toughness of the conductive material of Example 3 measured by nanoindentation method was 0.52 MPa√m.

Example 4

An electrolytic composition of the invention was prepared having the following components and concentrations:
200 g/L Copper sulfate
100 g/L Sulfuric acid
50 ppm Chloride ion
40 mg/L Accelerator agent (bis-(sodium-sulfonopropyl)-disulfide)
10 mg/L Suppressor agent (Tetronic 90R4® (BASF), wherein an average MW of 7000 g/mol, x/(x+y)=0.4)
1.5 mg/L Leveler agent (polyethylenimine having an average MW of 60000 g/mol).

The conductive feature was plated as follows with the above electrolytic composition. An agitated plating tank outfitted with multiple plating cells and one rectifier was charged with the above electrolytic composition. During plating, the following deposition conditions were employed typically: current density of 2 A/dm$^2$; waveform was DC; temperature plating bath was 25° C. After termination of the electrolytic plating process, a conductive material of Example 4 with 2 um of the thickness t2, 25 um of the width w, and 5 um of the thickness t3 (as shown in FIG. 2D) was obtained. It was found that the copper grain feature of the conductive material of Example 4 was large grain with copper twin crystal. It was found that the dishing depth d (as shown in FIG. 2D) of the conductive material of Example 4 was 1.7 um.

Comparative Example

The virgin-makeup solution, which is an electrolytic composition without any added organics (i.e., zero accelerator agent, suppressor agent, leveler agent), was used to plate the conductive feature as follows. An air-agitated plating tank outfitted with multiple cathode rails and one rectifier was charged with the above electrolytic composition. During plating, the following deposition conditions were employed: current density of 2 A/dm$^2$; waveform was DC; temperature plating bath was 25° C. After termination of the electrolytic plating process, a conductive material of Comparative Example with 2 um of the thickness t2, 25 um of the width w, and 5 um of the thickness t3 (as shown in FIG. 2D) was obtained. It was found that the copper grain feature of the conductive material of Comparative Example was copper twin crystal. It was found that the dishing depth d (as shown in FIG. 2D) of the conductive material of Comparative Example was 5 um. Further, the fracture toughness of the conductive material of Comparative Example measured by nanoindentation method was 0.53 MPa√m.

Comparing the results of the conductive materials of Examples 1-4 to the conductive materials of Comparative Example, it was observed that the dishing depth of the conductive material of each of Examples 1-4 was less than the dishing depth of the conductive material of Comparative Example. That is, the conductive material plated by using the electrolytic composition with the suppressor agent having the structure (1) or the structure (2) can have more flat surface profile than the conductive material plated by using the virgin-makeup solution. Further, comparing the results of the conductive materials of Examples 1-4 to the conductive materials of Comparative Example, it was also observed that the fracture toughness of the conductive material of each of Examples 1-4 was comparable to the fracture toughness of the conductive material of Comparative Example.

In accordance with an embodiment, a method of manufacturing a conductive structure includes: forming a seed layer; forming a conductive material on the seed layer by performing an electrolytic plating process with an electrolytic composition comprising: a source of copper ions; an accelerator agent; and a suppressor agent, represented by structure (1) or (2):

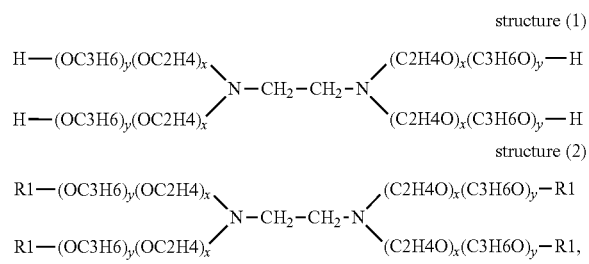

wherein x is between 2 and 50, y is between 5 and 75, and R1 is an alkyl group of 1 to 3 carbon atoms; and removing a portion of the seed layer exposed by the conductive material.

In accordance with an embodiment, a method of manufacturing a redistribution circuit structure includes: forming an inter-dielectric layer over a substrate; forming a seed layer over the inter-dielectric layer; forming a conductive pattern over the seed layer, wherein the seed layer and the conductive pattern comprise a same material, and the conductive pattern is formed by performing an electrolytic plating process with an electrolytic composition comprising: a source of copper ions; an accelerator agent; and a suppressor agent comprising a combination of ethylene oxide (EO) repeat units and propylene oxide (PO) repeat units arranged in a block co-polymer sequence and bonded to a diamine, wherein the ethylene oxide (EO) repeat units are bonded to a nitrogen atom of the diamine, and the molecular weight of the suppressor compound is between about 1000 and about 20,000; and selectively removing the seed layer exposed by the conductive material to form a seed layer pattern, wherein the conductive pattern and the seed layer pattern form a redistribution conductive pattern.

In accordance with an embodiment, a method of manufacturing a semiconductor package includes: providing a carrier having an integrated circuit and a plurality of conductive posts formed thereon; encapsulating the integrated circuit and the conductive posts with an insulating encapsulation, wherein the insulating encapsulation exposes at least part of the integrated circuit and at least part of the conductive posts; forming a redistribution circuit structure over the insulating encapsulation to electrically connect with the integrated circuit and the conductive posts, comprising: forming an inter-dielectric layer over the insulating encapsulation; forming a seed layer over the inter-dielectric layer; providing a mask having an opening over the seed layer, wherein the opening expose at least part of the seed layer; filling a conductive material into the opening by performing an electrolytic plating process with an electrolytic composition comprising: a source of copper ions; an accelerator agent; and a suppressor agent comprising a combination of ethylene oxide (EO) repeat units and propylene oxide (PO) repeat units arranged in a block co-polymer sequence and bonded to an ethylene diamine, wherein the ethylene oxide (EO) repeat units are bonded to a nitrogen atom of the diamine, and a ratio of EO repeat units to the sum of EO repeat units and PO repeat units is between about 0.1 and about 0.6; removing the mask to form a conductive pattern; removing the seed layer exposed by the conductive pattern to form a seed layer pattern, wherein the conductive pattern and the seed layer pattern form a redistribution conductive pattern; and removing the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a conductive structure, comprising:
   forming a seed layer;
   forming a conductive material on the seed layer by performing an electrolytic plating process with an electrolytic composition comprising:
   a source of copper ions;
   an accelerator agent; and
   a suppressor agent, represented by structure (1) or (2):

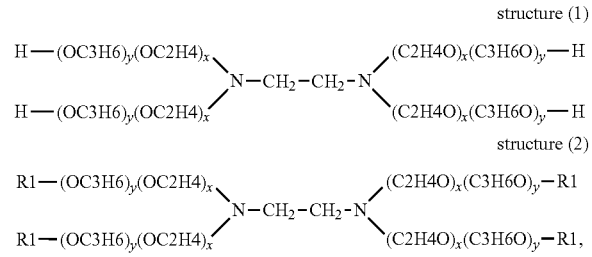

wherein x is between 2 and 50, y is between 5 and 75, and R1 is an alkyl group of 1 to 3 carbon atoms, and the suppressor agent is in a concentration between about 0.5 mg/L and about 20 mg/L of the electroplating composition; and
   removing a portion of the seed layer exposed by the conductive material.

2. The method according to claim 1, wherein x/(x+y)=0.1-0.6.

3. The method according to claim 1, wherein the suppressor agent has a molecular weight between about 1000 and about 20,000.

4. The method according to claim 1, wherein the accelerator agent is bis-(sodium-sulfonopropyl)-disulfide.

5. The method according to claim 1, wherein the accelerator agent is in a concentration between about 5 mg/L and about 50 mg/L of the electroplating composition.

6. The method according to claim 1, wherein the electrolytic plating process further comprises:
a leveler agent in a concentration between about 0.5 mg/L and about 10 mg/L of the electroplating composition.

7. The method according to claim 6, wherein the leveler agent is polyalkyleneimine.

8. The method according to claim 6, wherein the leveler agent has a molecular weight between about 5000 and about 100,000.

9. A method of manufacturing a redistribution circuit structure, comprising:
forming an inter-dielectric layer over a substrate;
forming a seed layer over the inter-dielectric layer;
forming a conductive pattern over the seed layer, wherein the seed layer and the conductive pattern comprise a same material, and the conductive pattern is formed by performing an electrolytic plating process with an electrolytic composition comprising:
a source of copper ions;
an accelerator agent; and
a suppressor agent, comprising a combination of ethylene oxide (EO) repeat units and propylene oxide (PO) repeat units arranged in a block co-polymer sequence and bonded to a diamine, wherein the ethylene oxide (EO) repeat units are bonded to a nitrogen atom of the diamine, and the molecular weight of the suppressor compound is between about 1000 and about 20,000, and the suppressor agent is in a concentration between about 0.5 mg/L and about 20 mg/L of the electroplating composition; and
selectively removing the seed layer exposed by the conductive material to form a seed layer pattern, wherein the conductive pattern and the seed layer pattern form a redistribution conductive pattern.

10. The method according to claim 9, wherein the suppressor agent comprises structure (1) or (2):

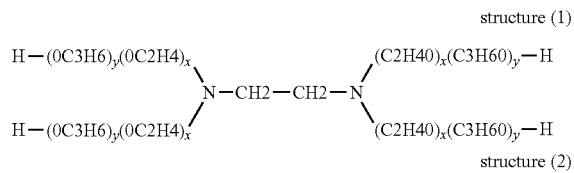

structure (1)

structure (2)

wherein x is between 2 and 50, y is between 5 and 75, x/(x+y)=0.1-0.6, and R1 is an alkyl group of 1 to 3 carbon atoms.

11. The method according to claim 9, wherein the accelerator agent is bis-(sodium-sulfonopropyl)-disulfide.

12. The method according to claim 9, wherein the accelerator agent is in a concentration between about 5 mg/L and about 50 mg/L of the electroplating composition.

13. The method according to claim 9, wherein the electrolytic plating process further comprises:
a leveler agent having a molecular weight between about 5000 and about 100,000.

14. The method according to claim 9, wherein the leveler agent is in a concentration between about 0.5 mg/L and about 10 mg/L of the electroplating composition.

15. The method according to claim 9, wherein the leveler agent is polyalkyleneimine.

16. A method of manufacturing a semiconductor package, comprising:
providing a carrier having an integrated circuit and a plurality of conductive posts formed thereon;
encapsulating the integrated circuit and the conductive posts with an insulating encapsulation, wherein the insulating encapsulation exposes at least part of the integrated circuit and at least part of the conductive posts;
forming a redistribution circuit structure over the insulating encapsulation to electrically connect with the integrated circuit and the conductive posts, comprising:
forming an inter-dielectric layer over the insulating encapsulation;
forming a seed layer over the inter-dielectric layer;
providing a mask having an opening over the seed layer, wherein the opening expose at least part of the seed layer;
filling a conductive material into the opening by performing an electrolytic plating process with an electrolytic composition comprising:
a source of copper ions;
an accelerator agent; and
a suppressor agent, comprising a combination of ethylene oxide (EO) repeat units and propylene oxide (PO) repeat units arranged in a block co-polymer sequence and bonded to an ethylene diamine, wherein the ethylene oxide (EO) repeat units are bonded to a nitrogen atom of the diamine, and a ratio of EO repeat units to the sum of EO repeat units and PO repeat units is between about 0.1 and about 0.6, and the suppressor agent is in a concentration between about 0.5 mg/L and about 20 mg/L of the electroplating composition;
removing the mask to form a conductive pattern;
removing the seed layer exposed by the conductive pattern to form a seed layer pattern, wherein the conductive pattern and the seed layer pattern form a redistribution conductive pattern; and
removing the carrier.

17. The method according to claim 16, wherein the seed layer and the conductive material comprise a same material.

18. The method according to claim 16, wherein the molecular weight of the suppressor compound is between about 1000 and about 20,000.

19. The method according to claim 16, wherein the suppressor agent comprises structure (1) or (2):

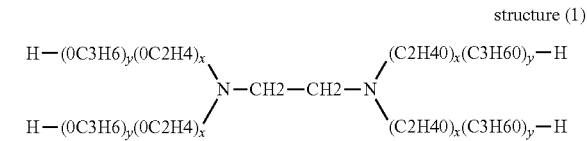

structure (1)

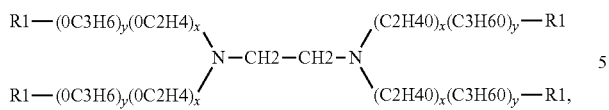
structure (2)
wherein x is between 2 and 50, y is between 5 and 75, and R1 is an alkyl group of 1 to 3 carbon atoms.
20. The method according to claim 16, wherein the source of copper ions is in a concentration between about 200 g/L and about 300 g/L of the electroplating composition.
* * * * *